(12) United States Patent
Kikinis

(10) Patent No.: US 11,329,599 B2
(45) Date of Patent: *May 10, 2022

(54) METHOD AND SYSTEM FOR CONNECTING SOLAR CELLS OR SLICES IN A PANEL SYSTEM

(71) Applicant: Tigo Energy, Inc., Los Gatos, CA (US)

(72) Inventor: Dan Kikinis, Los Altos, CA (US)

(73) Assignee: Tigo Energy, Inc., Los Gatos, CA (US)

( * ) Notice: Subject to any disclaimer, the term of this patent is extended or adjusted under 35 U.S.C. 154(b) by 172 days.

This patent is subject to a terminal disclaimer.

(21) Appl. No.: 14/964,342

(22) Filed: Dec. 9, 2015

(65) Prior Publication Data

US 2016/0094181 A1  Mar. 31, 2016

Related U.S. Application Data

(63) Continuation of application No. 12/253,868, filed on Oct. 17, 2008, now Pat. No. 9,218,013.

(60) Provisional application No. 61/003,091, filed on Nov. 14, 2007.

(51) Int. Cl.
| | |
|---|---|
| *H02S 40/30* | (2014.01) |
| *H02J 4/00* | (2006.01) |
| *H02J 1/00* | (2006.01) |
| *G05F 1/67* | (2006.01) |
| *H01L 31/02* | (2006.01) |
| *H01L 27/142* | (2014.01) |
| *H02M 3/335* | (2006.01) |

(52) U.S. Cl.
CPC ............ *H02S 40/30* (2014.12); *G05F 1/67* (2013.01); *H01L 27/1421* (2013.01); *H01L 31/02021* (2013.01); *H02J 1/00* (2013.01); *H02J 4/00* (2013.01); *H02M 3/33507* (2013.01); *Y02E 10/50* (2013.01)

(58) Field of Classification Search
CPC . H01L 31/02021; H01L 27/1421; G05F 1/67; H02J 1/00; H02J 4/00; H02J 7/035; H02S 40/30; H02M 3/33507; Y02E 10/50
See application file for complete search history.

(56) References Cited

U.S. PATENT DOCUMENTS

| | | | |
|---|---|---|---|
| 4,218,627 A | 8/1980 | Kiesel | |
| 4,580,090 A * | 4/1986 | Bailey | G05F 1/67 |
| | | | 323/282 |

(Continued)

FOREIGN PATENT DOCUMENTS

| | | |
|---|---|---|
| AU | 2005262278 | 7/2005 |
| DE | 4232356 | 3/1994 |

(Continued)

OTHER PUBLICATIONS

JP11-103538, Hayashi, Machine Translation, Apr. 1999.*

(Continued)

*Primary Examiner* — Devina Pillay

(74) *Attorney, Agent, or Firm* — Greenberg Traurig

(57) ABSTRACT

A method and system include a plurality of solar cells and a plurality of voltage controllers. Each of the plurality of solar cells is directly coupled to a dedicated one of the plurality of voltage controllers to form unique pairs of solar cells and voltage controllers. Each of a plurality of panels contain a plurality of unique pairs.

17 Claims, 6 Drawing Sheets

(56) References Cited

U.S. PATENT DOCUMENTS

| | | | |
|---|---|---|---|
| 4,659,947 A * | 4/1987 | Ogura | H03K 19/17708 326/100 |
| 4,706,010 A | 11/1987 | Callen et al. | |
| 4,736,151 A | 4/1988 | Dishner | |
| 4,847,546 A | 7/1989 | Bobier et al. | |
| 5,235,266 A | 8/1993 | Schaffrin | |
| 5,268,832 A | 12/1993 | Kandatsu | |
| 5,473,528 A | 12/1995 | Hirata et al. | |
| 5,604,430 A | 2/1997 | Decker et al. | |
| 5,886,890 A | 3/1999 | Ishida et al. | |
| 5,923,158 A | 7/1999 | Kurokami et al. | |
| 6,023,418 A | 2/2000 | Engira | |
| 6,081,104 A * | 6/2000 | Kern | H02J 9/065 320/101 |
| 6,275,016 B1 | 8/2001 | Ivanov | |
| 6,369,461 B1 | 4/2002 | Jungreis et al. | |
| 6,448,489 B2 | 9/2002 | Kimura et al. | |
| 6,650,031 B1 | 11/2003 | Goldack | |
| 6,844,739 B2 | 1/2005 | Kasai et al. | |
| 6,894,911 B2 | 5/2005 | Telefus et al. | |
| 6,984,970 B2 | 1/2006 | Capel | |
| 7,061,214 B2 | 6/2006 | Mayega et al. | |
| 7,248,946 B2 | 7/2007 | Bashaw et al. | |
| 7,256,566 B2 | 8/2007 | Bhavaraju et al. | |
| 7,265,524 B2 * | 9/2007 | Jordan | H02M 3/158 323/225 |
| 7,276,886 B2 | 10/2007 | Kinder et al. | |
| 7,518,346 B2 | 4/2009 | Prexl et al. | |
| 7,595,616 B2 | 9/2009 | Prexl et al. | |
| 7,605,498 B2 | 10/2009 | Ledenev et al. | |
| 7,719,140 B2 | 5/2010 | Ledenev et al. | |
| 8,158,877 B2 | 4/2012 | Klein et al. | |
| 9,218,013 B2 | 12/2015 | Kikinis | |
| 2001/0028571 A1 * | 10/2001 | Hanada | H02H 9/001 363/50 |
| 2002/0084767 A1 * | 7/2002 | Arai | H02J 7/35 320/101 |
| 2003/0094931 A1 * | 5/2003 | Renyolds | H02J 7/35 323/285 |
| 2004/0118446 A1 | 6/2004 | Toyomura | |
| 2004/0246752 A1 | 12/2004 | Chian et al. | |
| 2004/0257155 A1 | 12/2004 | McEwen | |
| 2005/0057214 A1 | 3/2005 | Matan | |
| 2005/0057215 A1 | 3/2005 | Matan | |
| 2005/0105224 A1 * | 5/2005 | Nishi | H02M 3/285 361/18 |
| 2005/0172995 A1 * | 8/2005 | Rohrig | H01L 31/02021 136/243 |
| 2006/0001406 A1 | 1/2006 | Matan | |
| 2006/0132113 A1 | 6/2006 | Cha et al. | |
| 2006/0152085 A1 * | 7/2006 | Flett | B60L 9/30 307/75 |
| 2006/0164065 A1 * | 7/2006 | Hoouk | H02J 7/35 324/76.17 |
| 2006/0174939 A1 | 8/2006 | Matan | |
| 2006/0176029 A1 * | 8/2006 | McGinty | H02M 3/155 323/222 |
| 2006/0185727 A1 | 8/2006 | Matan | |
| 2007/0273351 A1 | 11/2007 | Matan | |
| 2008/0121272 A1 | 5/2008 | Besser et al. | |
| 2008/0122449 A1 | 5/2008 | Besser et al. | |
| 2008/0122518 A1 | 5/2008 | Besser et al. | |
| 2008/0179949 A1 | 7/2008 | Besser et al. | |
| 2008/0191560 A1 | 8/2008 | Besser et al. | |
| 2008/0191675 A1 | 8/2008 | Besser et al. | |
| 2008/0236648 A1 * | 10/2008 | Klein | H01L 31/02021 136/244 |
| 2008/0303503 A1 * | 12/2008 | Wolfs | G05F 1/67 323/301 |
| 2009/0120485 A1 | 5/2009 | Kikinis | |

FOREIGN PATENT DOCUMENTS

| | | | |
|---|---|---|---|
| DE | 19961705 | 7/2001 | |
| EP | 0947905 A2 | 10/1999 | |
| EP | 0947905 A3 | 10/1999 | |
| EP | 1388774 | 2/2004 | |
| ES | 2249147 | 3/2006 | |
| JP | 10075580 | 3/1998 | |
| JP | 10285966 | 10/1998 | |
| JP | 11-103538 * | 4/1999 | H02J 7/35 |
| JP | 11103538 | 4/1999 | |
| JP | 2001224142 | 8/2001 | |
| JP | 2002339591 | 11/2002 | |
| KR | 20010044490 | 6/2001 | |
| WO | 2003012569 | 2/2003 | |
| WO | 2009064683 | 8/2009 | |

OTHER PUBLICATIONS

European Patent Application No. 08850862.7, extended Search Report, dated Jan. 2, 2018.

Alonso, R. et al., "A New Distributed Converter Interface for PV Panels," 20th European Photovoltaic Solar Energy Conference, Barcelona, Spain, pp. 2288-2291, Jun. 6-10, 2005.

Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.

Basso, Tim, "IEEE Standard for Interrconnecting Distributed Resources With the Electric Power System," IEEE PES Meeting, Jun. 9, 2004.

Bhatnagar, M. et al., "Silicon-Carbide High-Voltage (400V) Schottky Barrier Diodes," IEEE Electron Device Letters, vol. 13, No. 10, pp. 501-503, Oct. 10, 1992.

Boostbuck.com, "The Four Boostbuck Topologies," located at http://www.boostbuck.com/TheFourTopologies.html, 2003.

Enslin, Johan H.R., et al., "Integrated Photovoltaic Maximum Power Point Tracking Converter," IEEE Transactions on Industrial Electronices, vol. 44, No. 6, pp. 769-773, Dec. 1997.

Gautam, Nalin K. et al., "An Efficient Algorithm to Simulate the Electrical Performance of Solar Photovoltaic Arrays," Energy, vol. 27, No. 4, pp. 347-361, 2002.

International Patent Application No. PCT/US2008/082935, International Search Report and Written Opinion, dated Jun. 25, 2009.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.

Quaschning, V. et al., "Cost Effectiveness of Shadow Tolerant Photovoltaic Systems," Euronsun 96, pp. 819-824, Sep. 16, 1996.

Roman, Eduardo, et al., "Intelligent PV Module for Grid-Connectred PV Systems," IEEE Transactions on Industrial Electronics, vol. 53, No. 4, pp. 1066-1073, Aug. 2006.

Uriarte, S. et al., "Energy Integrated Management System for PV Applications," 20th European Photovoltaic Solar Energy Conference, Jun. 6, 2005.

Walker, G. R. et al., "Cascaded DC-DC Converter Connection of Photovoltaic Modules," 33rd IEEE Power Electronics Specialists Conference (PESC'02), vol. 1, pp. 24-29, 2002.

Walker, Geoffrey R. et al., "Cascaded DC-DC Converter Connection of Photovoltaic Modules," IEEE Transactions on Power Electronics, vol. 19, No. 4, pp. 1130-1139, Jul. 2004.

* cited by examiner

METHOD AND SYSTEM FOR CONNECTING SOLAR CELLS OR SLICES IN A PANEL SYSTEM

RELATED APPLICATIONS

The present application is a continuation application of U.S. patent application Ser. No. 12/253,868, filed Oct. 17, 2008 and entitled "Method and System for Connecting Solar Cells or Slices in a Panel System", which claims priority to Prov. U.S. Pat. App. Ser. No. 61/003,091, filed Nov. 14, 2007 and entitled "Enhanced Method for Connecting Solar Cells or Slices in a Panel System", the entire disclosures of which applications are hereby incorporated herein by reference.

BACKGROUND

Typically, solar panels may have a string of cells connected in series. As shown in FIG. 1, panel 100 has a string of cells 101ab-101nn connected in series. As illustrated, panel 100 is a 9×4 series of cells or slices. Two leads 102a,b deliver the series voltage of all the cells together. If one of the cells is defective, shaded, dirty, or otherwise degraded, it can reduce the output performance of the whole panel.

FIG. 2 shows a typical setup for a solar array system 201, in which a number of parallel strings of serial panels P11 to Pnn are used. If some of these panels are in a shaded area, as delineated by line 203a . . . n, the performance of the whole array 202ab-202nn may be undesirably affected. The strings are connected in parallel by lines 204, which may typically connect to an inverter.

FIG. 3 shows a solar array system 301 having panels 302a . . . n, with each panel having an attached management unit 304a-n. Each panel 302a . . . n and its associated management unit 304a-n are connected in parallel. Each of the management units 304a-n converts the voltage of the associated panel to high voltage for transmission on a bus. If a particular panel is shaded or if its performance is degraded by any other factors, this approach can help to limit the undesirable impact to the particular panel that is affected Degradation of the performance of the string, of which the affected panel is a part, can be reduced to some degree.

Improved efficiency of panels, both by themselves as well as in larger groups, is needed.

SUMMARY OF THE DESCRIPTION

In one of many embodiments of the present invention, a method and system include a plurality of solar cells and a plurality of voltage controllers. Each of the plurality of solar cells is directly coupled to a dedicated one of the plurality of voltage controllers to form unique pairs of solar cells and voltage controllers. Each of a plurality of panels contain a plurality of unique pairs.

Other features and embodiments of the present invention will be apparent from the accompanying drawings and from the following detailed description.

BRIEF DESCRIPTION OF THE DRAWINGS

The present disclosure is illustrated by way of example and not limitation in the figures of the accompanying drawings in which like references indicate similar elements.

DETAILED DESCRIPTION

In the following description, for purposes of explanation, numerous specific details are set forth in order to provide a thorough understanding of the description. It will be apparent, however, to one skilled in the art that embodiments of the disclosure can be practiced without these specific details. In other instances, structures and devices are shown in block diagram form in order to avoid obscuring the description.

Reference in this specification to one embodiment", an embodiment", "other embodiments", or the like means that a particular feature, structure, or characteristic described in connection with the embodiment is included in at least one embodiment of the disclosure. The appearances of, for example, the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
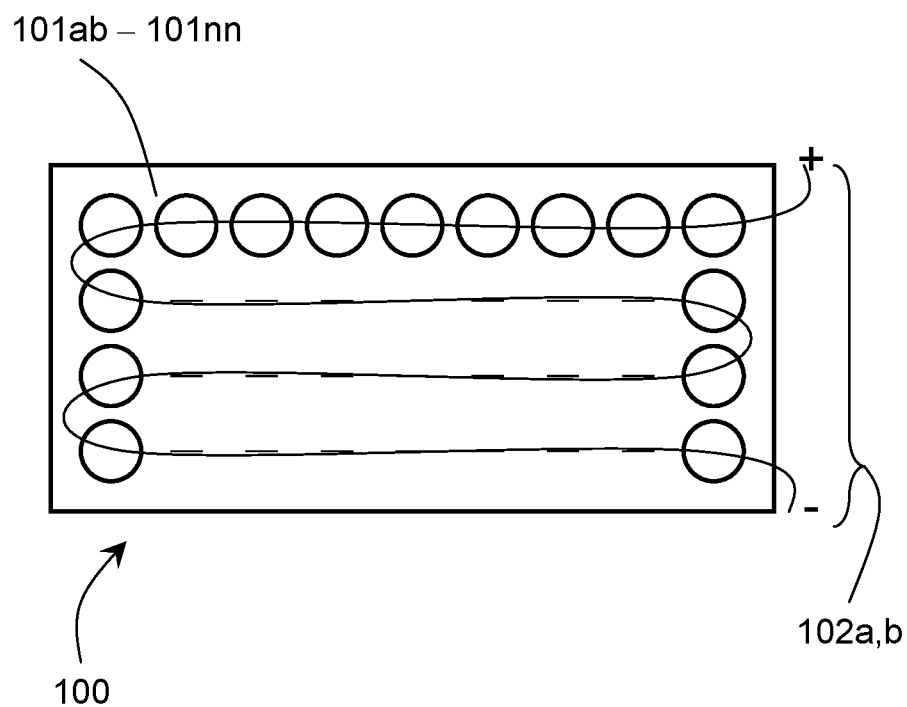
FIG. 1 illustrates a conventional panel in accordance with the prior art.
Figure 2:
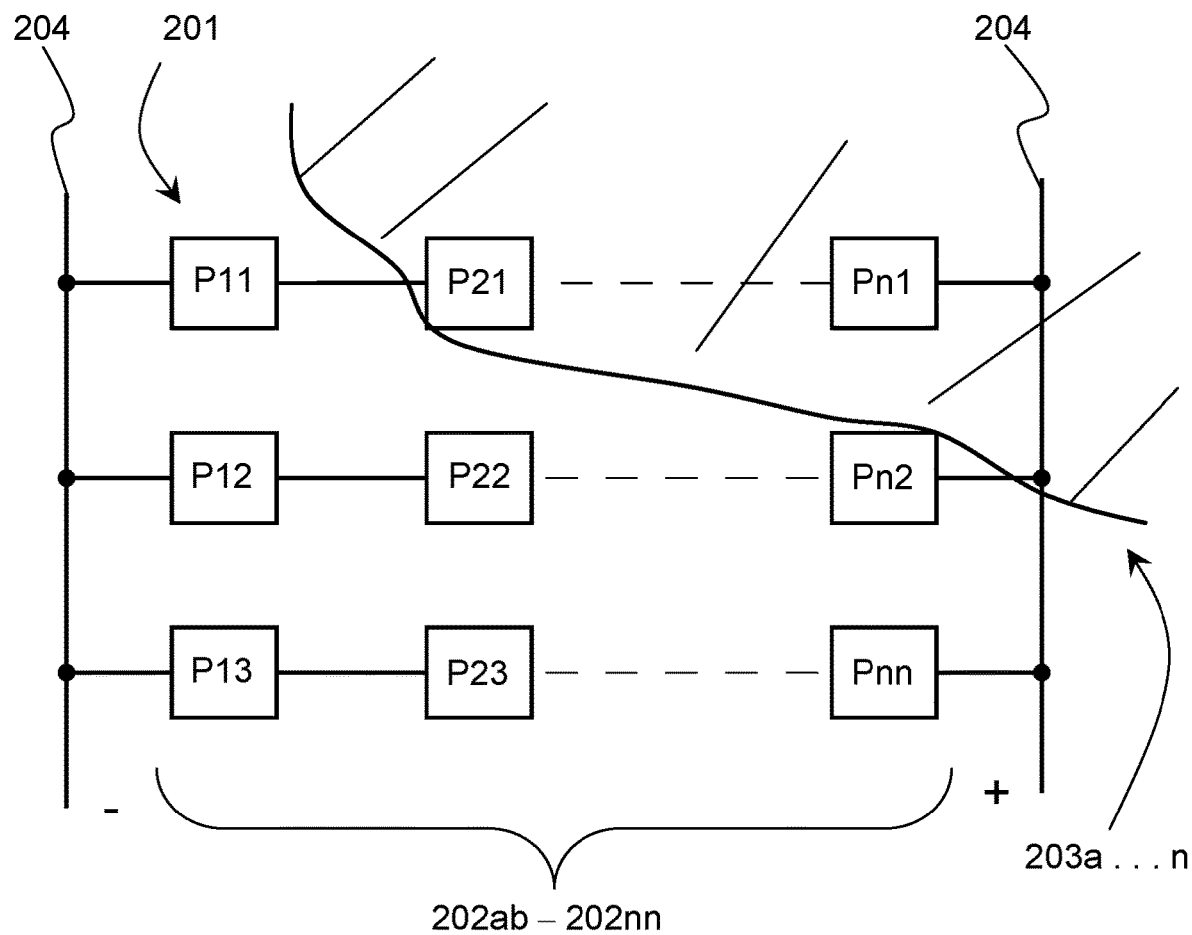
FIG. 2 illustrates a conventional solar array in accordance with the prior art.
Figure 3:
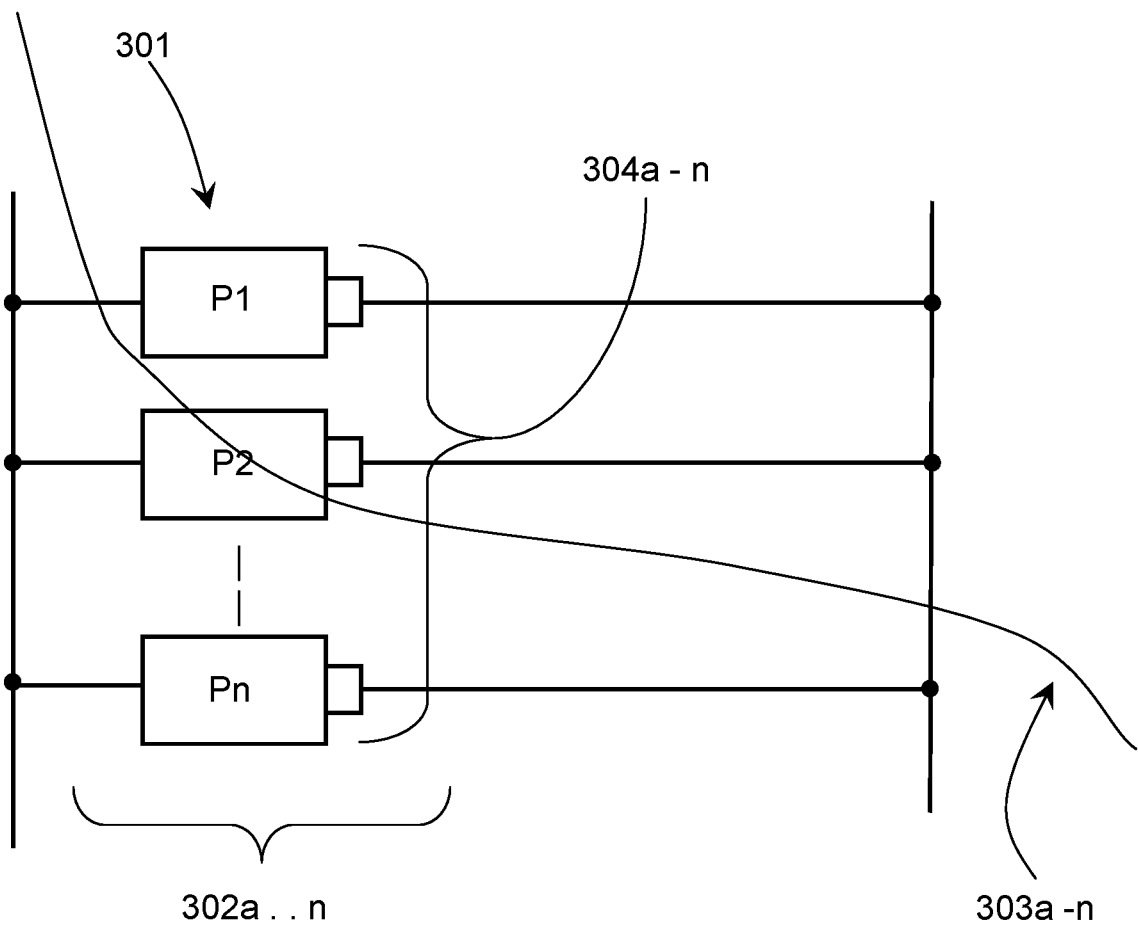
FIG. 3 illustrates a conventional solar array with panels having associated management units in accordance with the prior art.
Figure 4:
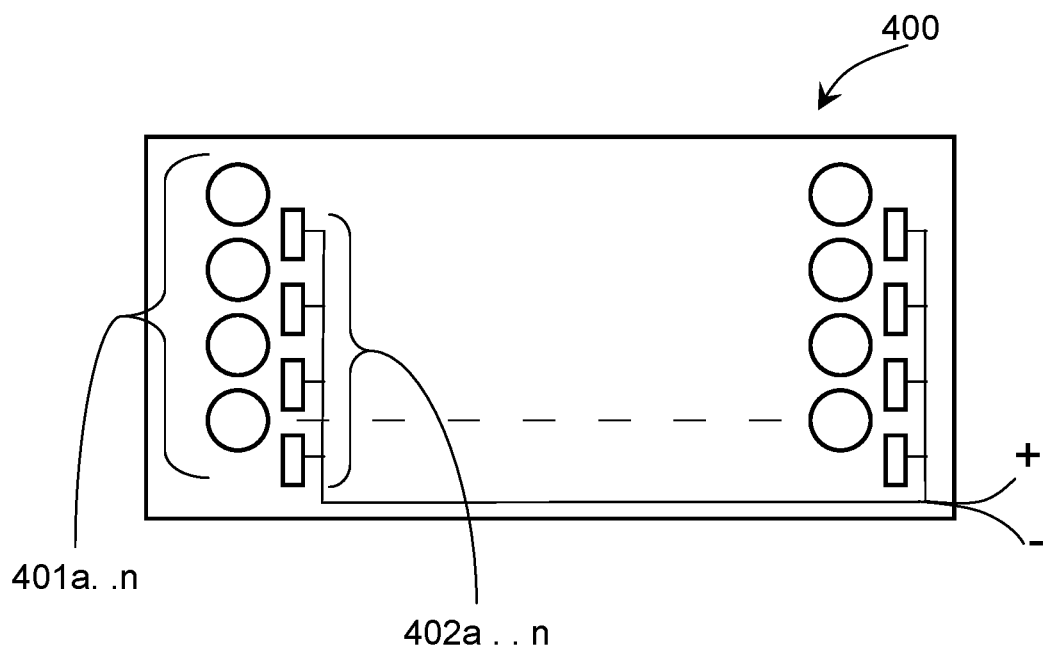
FIG. 4 illustrates a panel in accordance with one embodiment of the present invention.

FIG. 4 shows an exemplary panel 400 in accordance with one embodiment of the present invention. The panel 400 is a 4×9 array of solar cells or slices 401a . . . n. Each cell or slice 401a . . . n has its own voltage controller/converter (VCC) 402a . . . n to provide dc voltage, so each of the cells has power over the whole panel. In one embodiment, the output of the voltage controller/converter (VCC) 402a . . . n may be provided as a current source. In another embodiment, the output of the voltage controller/converter (VCC) 402a . . . n may be provided as a voltage source. In the case of a current source output, all the panels would provide the same current, but the voltage would vary according to the solar power available to each panel. In the case of a voltage source output, all the panels would provide the same voltage, but the current source would depend on the energy available. In some embodiments, rather than a single cell, two, four, or any other suitable low number of cells can be connected together to one voltage controller/converter (VCC) 402a . . . n. The cell to VCC ratio is a tradeoff between cost, efficiency of conversion, and efficiency of the panel. Different slices (cells) and different VCCs can result in a different optimal number of cell to VCC ratio.

Figure 5A:
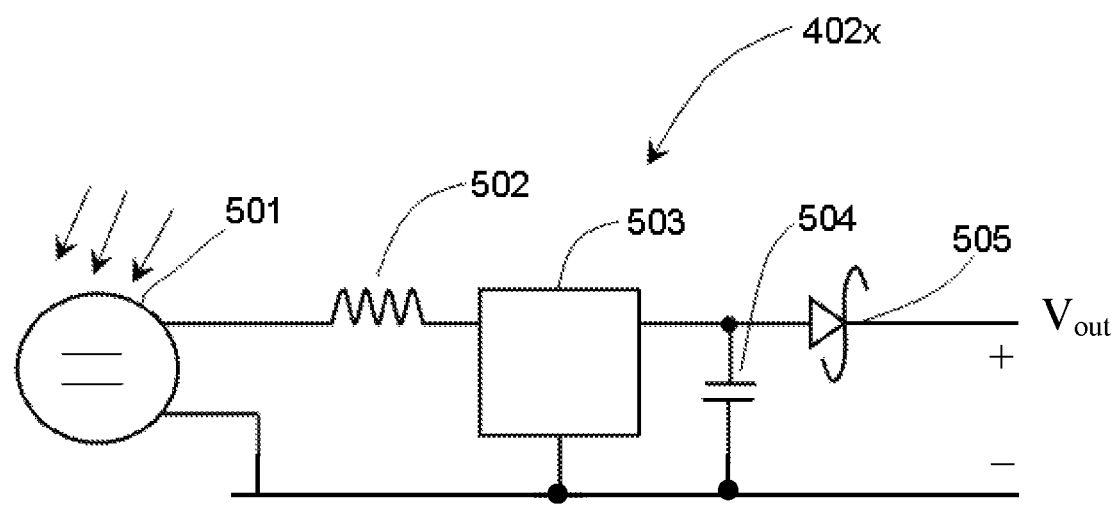
FIG. 5a illustrates a voltage controller/converter in accordance with one embodiment of the present invention.
Figure 5B:
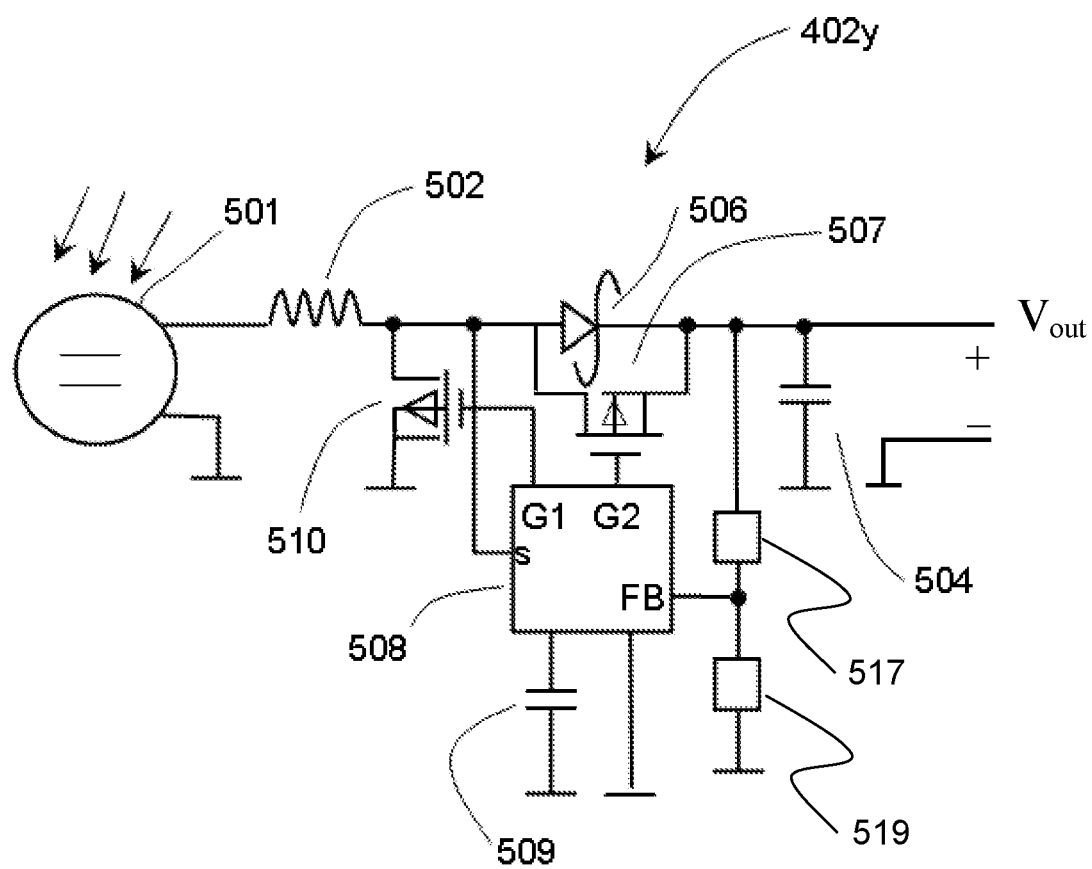
FIG. 5b illustrates a voltage controller/converter in accordance with another embodiment of the present invention.

FIGS. 5a and 5b show two exemplary embodiments of voltage controllers/converters (VCC) 402a-n in FIG. 4 as controller 402x and controller 402y, respectively. As shown in FIG. 5a, the controller 402x is connected with a cell or slice 501. The controller 402x includes an external rectifier 502, a single chip regulator 503, a capacitor 504, and a Schottky diode 505. Voltage is switched by the single chip regulator 503, using the external rectifier 502 and the capacitor 504. The Schottky diode 505 avoids back-flow current. While the Schottky diode 505 is used in one embodiment to improve efficiency, in other embodiments Schottky diode 505 is not used. The single chip regulator 503 and a controller chip 508, which is discussed below, may be implemented as an integrated chip available from companies such as Maxim, Fairchild, Analog Devices, AnalogicTech, and other vendors who manufacture suitable components.

As shown in FIG. 5b, the controller 402y is connected with a cell or slice 511. The controller 402y includes a rectifier 513, a transistor 510, the controller chip 508, a capacitor 509, a transistor 507, a Schottky diode 506, a capacitor 504, a resistor 517, and a resistor 519. In one embodiment, the transistor 507 and the transistor 510 are p-channel MOSFETs. The controller 402y uses synchronous rectification and bucking (switching of a buck converter) with the transistors 507 and 510, respectively, and the Schottky diode 506. The controller chip 508 has a sense pin S connected to the input side of the circuit at the inductor 502 allowing it to sense how much current is delivered during the "on" phase of the transistor 510 and therefore to calculate the optimal timing. The capacitor 509 may be used for bootstrapping the chip when started with very low voltage until the output voltage is available and stable. Feedback pin FB can source current from the output side. It can also be used to measure the output voltage and in some cases synchronous rectification. The resistors 517 and 519 act as a voltage divider to set the nominal output voltage.

Gate control lines G1 and G2 control the gate of transistor 510 and the gate of transistor 507, respectively. They are used to drive the synchronously bucking gate (of transistor 510) and rectifier gate controls. Output capacitor 504 is used to keep the voltage stable during bucking. In one embodiment, all of the voltage controllers/converters (VCC) 402a . . . n can push a fixed voltage, and the current source could depend on the current of each solar cell available.

Currently, single chip regulator 503, as an integrated chip, has been available for very low currents that are measured in the hundreds of milliamps. However, single chip regulator 503 can be used not only for personal electronic devices but also for power generation solar panels. Likewise, in one embodiment, an approach such as that described for the operation of controller chip 508 could be integrated into a full chip, where chopping and synchronous rectifying transistors are integrated as well.

In one embodiment, rather than a parallel wiring system, a converter, or controller, may be used to generate a preset, given current, and all the converters, or controllers, will be wired in series, as to create a current source, rather than a voltage source. Based on the maximum output power of each cell or group of cells, a open load voltage limit may be applied, as to avoid run-away voltages at low loads.

In one embodiment, bootstrap charge pumps could be used to increase initial voltage during startup operations. Some precautions can be taken to avoid flow-back current during startup by waiting for stabilization of the bootstrap voltage before turning the main buck converter. In one embodiment, use of push-pull switching or other useful topology for the converter may be used.

In various embodiments of the present invention, hardwired circuitry may be used in combination with software instructions to implement the techniques. Thus, the techniques are neither limited to any specific combination of hardware circuitry and software nor to any particular source for the instructions executed by the data processing system.

In the foregoing specification the invention has been described with reference to specific exemplary embodiments thereof. It is clear that many modifications and variations of these embodiments may be made by one skilled in the art without departing from the spirit of the disclosure of the invention. These modifications and variations do not depart from the broader spirit and scope of the invention, and the examples cited here are to be regarded in an illustrative rather than a restrictive sense.

What is claimed is:

1. A solar panel, comprising:
a plurality of solar cells; and
a plurality of voltage controllers, wherein each of the plurality of voltage controllers is directly coupled to a different one of the plurality of solar cells;
wherein each respective voltage controller comprises:
a single chip regulator having a buck converter, an input terminal, and an output terminal;
a capacitor connected to the output terminal of the single chip regulator;
a diode connected to the output terminal of the single chip regulator; and
a second capacitor configured to bootstrap the single chip regulator;
wherein the single chip regulator comprises:
a first transistor connected in parallel with one or more of the plurality of solar cells; and
a second diode connected in series with the capacitor, wherein a series connection from the second diode to the capacitor is connected in parallel with the first transistor and the one or more of the plurality of solar cells.

2. The solar panel of claim 1, further comprising:
a second transistor connected to the single chip regulator as a controllable switch.

3. The solar panel of claim 2, wherein the single chip regulator includes:
a first drive connection coupled to the first transistor and configured to control bucking operations of the first transistor; and
a second drive connection coupled to the second transistor and configured to control synchronous rectification operations of the second transistor.

4. The solar panel of claim 3, wherein the plurality of solar cells further comprises a voltage divider connected in parallel with the capacitor; and the single chip regulator includes a feedback pin coupled to the voltage divider.

5. The solar panel of claim 3, wherein the second capacitor is configured to bootstrap the single chip regulator before bucking operations of the first transistor.

6. The solar panel of claim 3, wherein the single chip regulator includes a sense pin coupled to a connection point of the second transistor, the first transistor and the diode.

7. The solar panel of claim 6, wherein the sense pin is configured to sense how much current is delivered during a certain predetermined phase of the second transistor.

8. The solar panel of claim 7, wherein the sense pin is configured to sense how much current is delivered during an "on" phase of the second transistor.

9. A solar panel, comprising:
a panel having a front side;
an array of solar cells mounted on the front side of the panel;
a voltage controller directly coupled to each solar cell of the array of solar cells; and
an array of single chip regulators connected to the array of solar cells;
wherein each single chip regulator of the array of single chip regulators comprises:
a buck converter;
an input connected to receive power from a respective pair of solar cells in the array of solar cells; and
an output to provide the power generated by the respective pair of solar cells;

wherein the solar panel further comprises:
  a respective capacitor connected to the output of a respective single chip regulator of the array of single chip regulators;
  a respective diode connected to the output of the respective single chip regulator of the array of single chip regulators; and
  the respective capacitor configured to bootstrap the respective single chip regulator of the array of single chip regulators;
wherein the single chip regulator comprises:
  a respective first transistor connected in parallel with the array of solar cells; and
  a respective second diode connected in series with the respective capacitor, wherein a series connection from the second diode to the respective capacitor is connected in parallel with the respective first transistor and the array of solar cells.

10. The solar panel of claim 9, wherein the output of the respective single chip regulator of the array of single chip regulators is configured as a voltage source; and outputs of the single chip regulators are connected in parallel as an output of the solar panel.

11. The solar panel of claim 9, wherein the output of the respective single chip regulator of the array of single chip regulators is configured as a current source; and outputs of the single chip regulators are connected in series as an output of the solar panel.

12. The solar panel of claim 9, further comprising:
  a respective second transistor connected to the respective single chip regulator of the array of single chip regulators as a controllable switch.

13. The solar panel of claim 12, further comprising:
  a respective first drive connection coupled to the respective first transistor and configured to control bucking operations of the respective first transistor; and
  a respective second drive connection coupled to the respective second transistor and configured to control synchronous rectification operations of the respective second transistor.

14. The solar panel of claim 13, further comprising:
  a respective voltage divider connected in parallel with a respective capacitor; and
  a respective feedback pin coupled to the respective voltage divider.

15. The solar panel of claim 13, wherein the respective capacitor is configured to bootstrap the respective single chip regulator of the array of single chip regulators before bucking operations of the respective first transistor.

16. The solar panel of claim 13, further comprising a respective sense pin coupled to a connection point of the respective second transistor, the respective first transistor and the respective diode.

17. The solar panel of claim 16, wherein the respective sense pin is configured to sense how much current is delivered during a certain predetermined phase of the respective second transistor.

* * * * *